(12) United States Patent
Wu

(10) Patent No.: US 12,153,252 B2
(45) Date of Patent: Nov. 26, 2024

(54) METHOD FOR MANUFACTURING PHOTOELECTRIC COMPOSITE CIRCUIT BOARD

(71) Applicants: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Taipei (TW)

(72) Inventor: Wei-Liang Wu, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 18/227,984

(22) Filed: Jul. 31, 2023

(65) Prior Publication Data

US 2023/0375780 A1    Nov. 23, 2023

Related U.S. Application Data

(62) Division of application No. 17/331,019, filed on May 26, 2021, now Pat. No. 11,754,781.

(30) Foreign Application Priority Data

May 8, 2021    (CN) .......................... 202110500582.X

(51) Int. Cl.
*G02B 6/12*    (2006.01)
*G02B 6/13*    (2006.01)
(Continued)

(52) U.S. Cl.
CPC .......... *G02B 6/12004* (2013.01); *G02B 6/13* (2013.01); *H05K 1/0274* (2013.01);
(Continued)

(58) Field of Classification Search
CPC ........ G02B 6/428; G02B 6/4214; G02B 6/13; G02B 6/12004; G02B 6/12; H05K 1/0274;
(Continued)

(56) References Cited

U.S. PATENT DOCUMENTS 5,195,154 A  *  3/1993  Uchida ................ G02B 6/4246
                                                    385/88
11,002,927 B2 * 5/2021  Chang ..................... H01L 25/18
(Continued)

FOREIGN PATENT DOCUMENTS

CN        104133271 A    11/2014
CN        105339820 A     2/2016
(Continued)

OTHER PUBLICATIONS

CN 104220910 B (English Translation) (Year: 2017).*
TW 1406020 B (English Translation) (Year: 2013).*

*Primary Examiner* — Balram T Parbadia
*Assistant Examiner* — Mary A El-Shammaa
(74) *Attorney, Agent, or Firm* — ScienBiziP, P.C.

(57) ABSTRACT

A method for manufacturing a photoelectric composite circuit board, includes providing a copper-clad carrier and an intermediate circuit, the copper-clad carrier includes a substrate layer and a bottom copper layer, a first groove is defined on the intermediate circuit. Forming an optical fiber in the first groove. Forming a first accommodating groove and a second accommodating groove at each end the optical fiber. Accommodating a first coupling element in the first accommodating groove. Removing the substrate layer.
(Continued)

Removing the bottom copper layer corresponding to the optical fiber, the intermediate circuit on one side of the optical fiber and the bottom copper layer forming a first circuit substrate, the intermediate circuit on another side of the optical fiber and the bottom copper layer forming a second circuit substrate. Electrically connecting a chip to the first circuit substrate, and electrically connecting an electronic component to the second circuit substrate.

11 Claims, 10 Drawing Sheets

(51) Int. Cl.
  *H05K 1/02* (2006.01)
  *H05K 3/00* (2006.01)
  *H05K 3/46* (2006.01)
(52) U.S. Cl.
  CPC ......... *H05K 1/0298* (2013.01); *H05K 3/0061* (2013.01); *H05K 3/007* (2013.01); *H05K 3/4611* (2013.01); *H05K 2201/10106* (2013.01); *H05K 2201/10121* (2013.01)
(58) Field of Classification Search
  CPC .... H05K 1/0298; H05K 3/007; H05K 3/0061; H05K 3/4611; H05K 2201/10106; H05K 2201/10121
  See application file for complete search history.

(56) References Cited

U.S. PATENT DOCUMENTS

| | | | | |
|---|---|---|---|---|
| 2006/0034560 | A1* | 2/2006 | Morris | G02B 6/43 385/14 |
| 2009/0067779 | A1* | 3/2009 | Furuyama | H05K 1/0206 385/14 |
| 2013/0064499 | A1* | 3/2013 | Satoh | G02B 6/4214 385/14 |
| 2013/0195470 | A1* | 8/2013 | Yasuda | G02B 6/4214 29/592.1 |
| 2014/0341514 | A1* | 11/2014 | Lin | G02B 6/43 385/89 |
| 2015/0277071 | A1* | 10/2015 | Matsuoka | G02B 6/428 385/88 |
| 2016/0062063 | A1* | 3/2016 | Ogura | G02B 6/305 264/1.27 |
| 2017/0126318 | A1* | 5/2017 | Chang | G02B 6/4292 |
| 2019/0129106 | A1* | 5/2019 | Inoue | G02B 6/4214 |
| 2019/0206591 | A1* | 7/2019 | Kim | G06F 1/266 |
| 2021/0036466 | A1* | 2/2021 | Ishida | G02B 6/4284 |

FOREIGN PATENT DOCUMENTS

| | | | | |
|---|---|---|---|---|
| CN | 104220910 B | * | 11/2017 | ......... G02B 6/12004 |
| TW | 406020 B1 | * | 8/2013 | ........... A61K 31/335 |

* cited by examiner

METHOD FOR MANUFACTURING PHOTOELECTRIC COMPOSITE CIRCUIT BOARD

CROSS-REFERENCE TO RELATED APPLICATIONS

This is a divisional application of patent application Ser. No. 17/331,019 filed on May 26, 2021, assigned to the same assignee, which is based on and claims priority to China Patent Application No. 202110500582.X filed on May 8, 2021, the contents of which are incorporated by reference herein.

FIELD

The subject matter herein generally relates to circuit boards, and more particularly, to a photoelectric composite circuit board and a method for manufacturing the circuit board.

BACKGROUND

Circuit boards may include circuit substrates and electronic components mounted on the circuit substrate. Such electronic components may be electrically connected to the circuit substrate through metal wires. That is, the electronic components and the circuit substrate communicate through electric signals. However, communications through electric signals have low transmission speeds and high loss, thus the circuit board does not match the requirement of optical communication.

BRIEF DESCRIPTION OF THE DRAWINGS

Implementations of the present technology will now be described, by way of example only, with reference to the attached figures.

DETAILED DESCRIPTION

Figure 1:
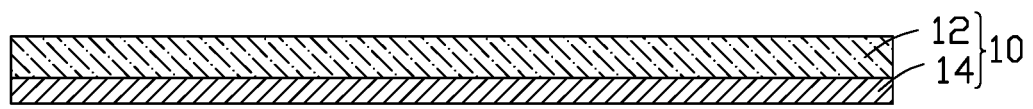
FIG. 1 is a cross-sectional view of an embodiment of a copper-clad carrier.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Figure 12:
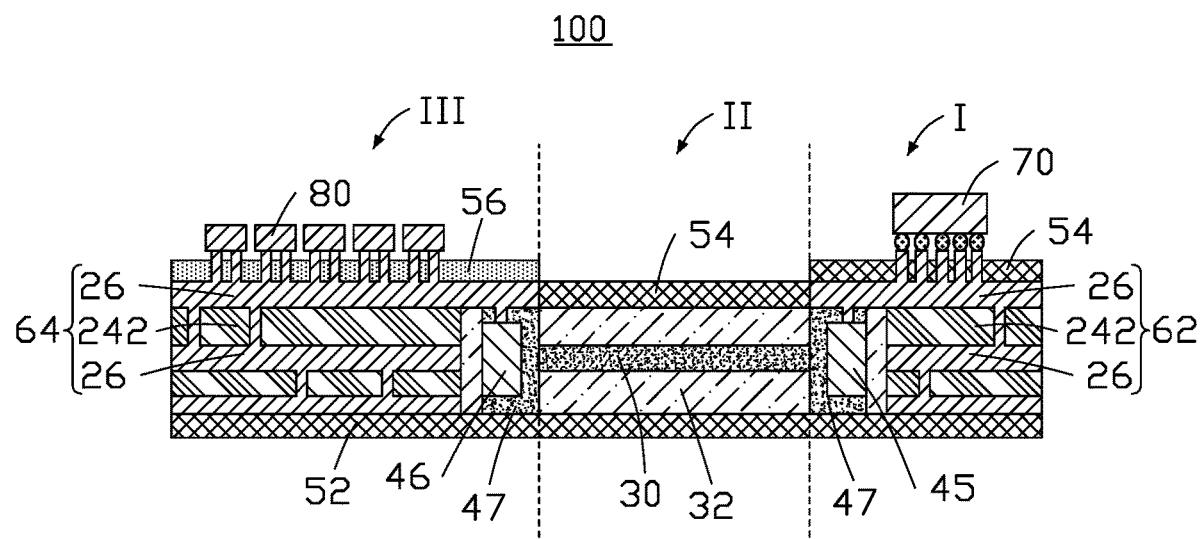
FIG. 12 is a cross-sectional view showing electronic chips connected on the first circuit substrate and electronic components connected on the second circuit substrate of FIG. 11, thereby obtaining a photoelectric composite circuit board.
Figure 13:
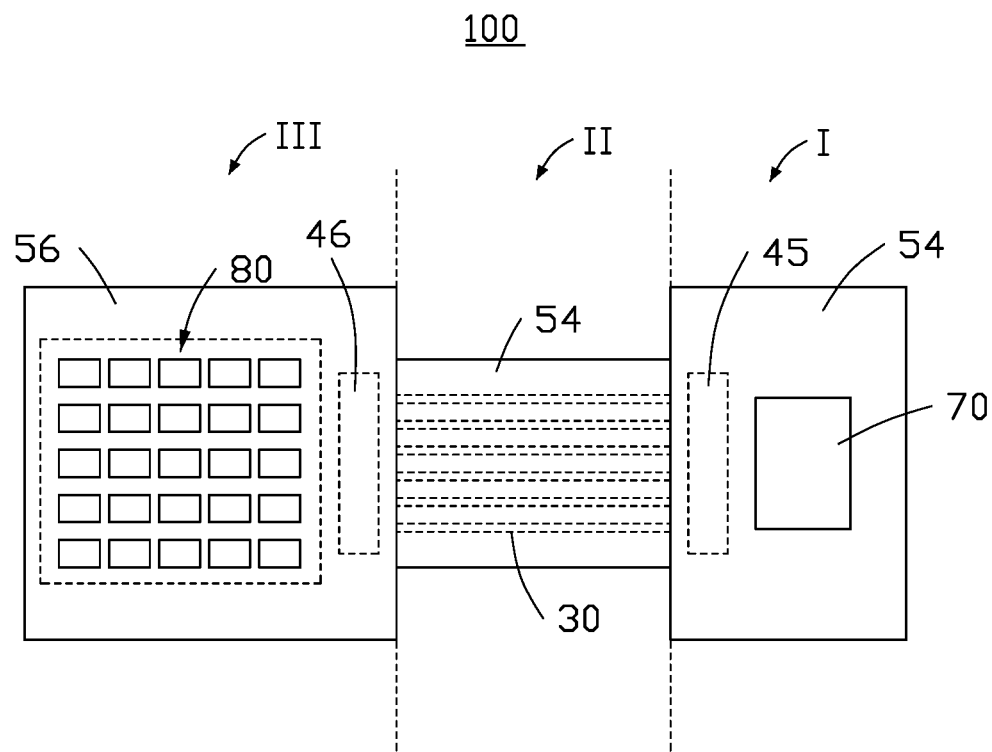
FIG. 13 is a top view of the photoelectric composite circuit board of FIG. 12.

Referring to FIGS. 12 and 13, a photoelectric composite circuit board (hereinafter "circuit board") 100 is provided, which includes a first area I, a second area II, and a third area III connected in sequence.

The first area I includes a first circuit substrate 62, a first coupling element 45, and a chip 70. Both the first coupling element 45 and the chip 70 are electrically connected to the first circuit substrate 62. The first coupling element 45 is disposed at an end of the first circuit substrate 62 adjacent to the second area II. The chip 70 is used for signal processing.

In some embodiments, the first coupling element 45 is sealed on the first circuit substrate 62 by a transparent glue 47 to reduce signal loss during optical transmission.

The second area II includes an optical fiber 30 and an insulating layer 32. The optical fiber 30 is accommodated in the insulating layer 32, and the insulating layer 32 is used to protect the optical fiber 30. An optical channel formed between the first coupling element 45 and the optical fiber 30 is optically aligned, thus enabling the reception and transmission of optical signals.

The second area II is a light transmission area. Refractive index of the optical fiber 30 is relatively high, thereby facilitating a refraction of light. The optical fiber 30 can be made of a material with higher transparency and better flexibility. The refractive index of the insulating layer 32 is lower than the refractive index of the optical fiber 30, so that the light is fully contained in the optical fiber 30, and prevents the light transmitted in the optical fiber 30 from being refracted in the insulating layer 32 to interfere with optical signal. The insulating layer 32 can be made of at least one of polymethyl methacrylate (PMMA), polystyrene (PS), and polycarbonate (PC).

The third area III includes a second circuit substrate 64, a second coupling element 46 and an electronic component 80. Both the second coupling element 46 and the electronic component 80 are electrically connected to the second circuit substrate 64. The second coupling element 46 is disposed at an end of the second circuit substrate 64 adjacent to the second area II.

In some embodiments, an optical channel formed between the second coupling element 46 and the optical fiber 30 is optically aligned, thus enabling optical signals. The second coupling element 46 is sealed on the second circuit substrate 64 by the transparent glue 47 to reduce signal loss during optical transmission.

Each end of the optical fiber 30 is exposed from the insulating layer 32, and the first coupling element 45 and the second coupling element 46 are both connected to the optical fiber 30 through the transparent glue 47, thereby effectively reducing signal loss during light transmission.

The electronic components 80 may be one or all of LED arrays, light emitting diodes, waveguides, optical fibers, lenses, light detectors, and light sensitive semiconductors.

In some embodiments, the circuit board 100 further includes a first protective layer 52 and a second protective layer 54. The first protective layer 52 covers the insulating layer 32 and the surface of the transparent glue 47, and the second protective layer 54 covers a surface of the insulating layer 32 facing away from the first protective layer 52. The first protective layer 52 and the second protective layer 54 protect the optical fiber 30, the first coupling element 45, and the second coupling element 46 during the optical signal transmission process, and prevent external signals interfering with or causing loss of optical signals.

In some embodiments, the first protective layer 52 further covers surfaces of the first circuit substrate 62 and the second circuit substrate 64, and the second protective layer 54 further covers the surface of the first circuit substrate 62. The first protective layer 52 and the second protective layer 54 can protect the circuit layer 26 of the first circuit substrate 62 and the second circuit substrate 64 and prevents interference by external signals.

The first protective layer 52 and the second protective layer 54 can be made of flexible polymer materials, such as polyimide (PI), polyethylene terephthalate (PET), and liquid crystal polymer (LCP), so that the circuit board 100 in the second area II has a certain flexibility.

In some embodiments, when the electronic component 80 is an LED array, the circuit board 100 further includes an ink layer 56. The ink layer 56 is disposed on a surface of the second circuit substrate 64 to which the electronic component 80 is connected, and the ink layer 56 improves a reflection efficiency of the LED array.

Figure 14:
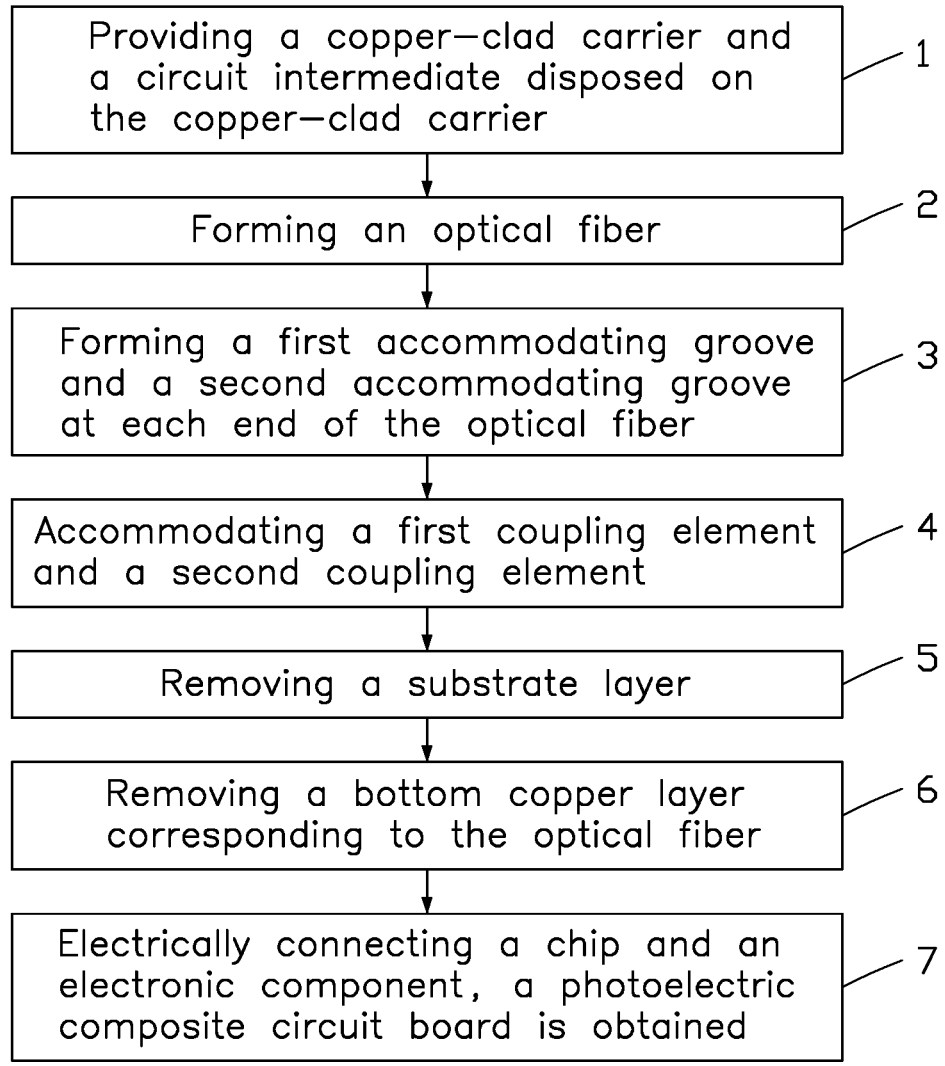
FIG. 14 is a flowchart of an embodiment of a method for manufacturing a photoelectric composite circuit board.

Referring to FIGS. 1 to 16, a method for the manufacturing of the circuit board 100 is provided in accordance with an embodiment. The method is provided by way of example, as there are a variety of ways to carry out the method. Referring to FIG. 14, the method can begin at block 1.

Figure 2:
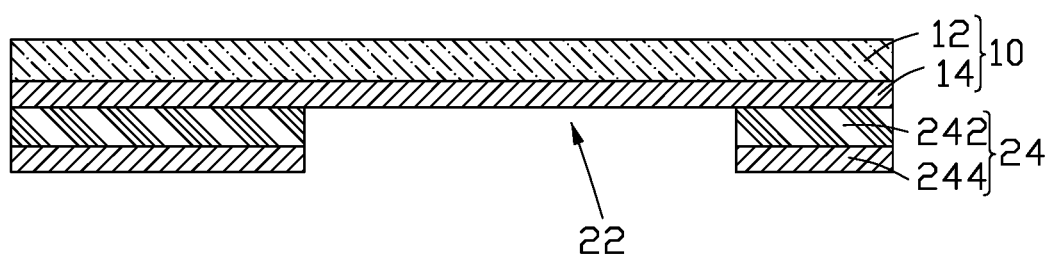
FIG. 2 is a cross-sectional view showing a copper-clad board pressed on the copper-clad carrier of FIG. 1 and a first groove defined in the copper-clad board.
Figure 4:
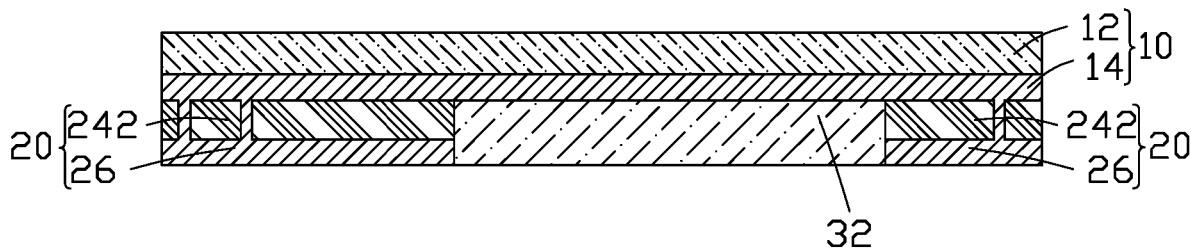
FIG. 4 is a cross-sectional view showing circuit formed in the copper-clad board of FIG. 3 to form an intermediate circuit.

In block 1, referring to FIGS. 1, 2, and 4, a copper-clad carrier 10 and an intermediate circuit 20 disposed on a surface of the copper-clad carrier 10 are provided. The copper-clad carrier 10 includes a substrate layer 12 and a bottom copper layer 14 on a surface of the substrate layer 12. The intermediate circuit 20 includes a first groove 22, and the bottom copper layer 14 is exposed from the first groove 22.

The substrate layer 12 is used for support during manufacture and will be removed after manufacturing is complete. As long as the substrate layer 12 can meet a certain value of hardness, a material of the substrate layer 12 is not limited. The bottom copper layer 14 is used for circuit production to form a circuit in the subsequent manufacturing process.

The intermediate circuit 20 includes a circuit layer 26 and a dielectric layer 242, and the circuit layer 26 and the dielectric layer 242 are laminated together. The circuit layer 26 may be one layer or multiple layers. When the circuit layer 26 is multilayer, all circuits are electrically connected.

Figure 15:
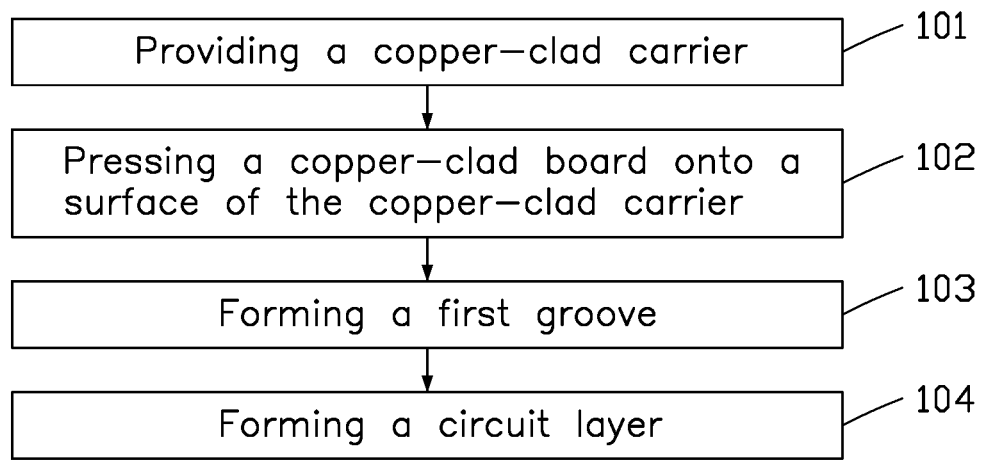
FIG. 15 is a sub-flowchart of the method of FIG. 14.

In some embodiments, referring to FIG. 15, a method for forming the intermediate circuit 20 on the surface of the copper-clad carrier 10 may include the following blocks.

In block 101, referring to FIG. 1, the copper-clad carrier 10 is provided.

In block 102, referring to FIG. 2, a copper-clad board 24 is pressed onto the surface of the copper-clad carrier 10, and the copper-clad board 24 includes a dielectric layer 242 and a copper layer 244. The dielectric layer 242 covers the surface of the bottom copper layer 14.

In block 103, referring to FIG. 2 again, along a stacking direction of the copper-clad carrier 10 and the copper-clad board 24, the first groove 22 penetrating the copper layer 244 and the dielectric layer 242 is formed, and the bottom copper layer 14 is exposed from the first groove 22.

In block 104, referring to FIG. 4, circuit fabrication is performed on the copper layer 244 to form the circuit layer 26, so that the intermediate circuit 20 is formed on the surface of the copper-clad carrier 10.

In some embodiments, the copper layer 244 is fabricated to form a circuit, the copper-clad board 24 can be pressed to form a multi-layer circuit.

In some embodiments, the block of forming the intermediate circuit 20 on the surface of the copper-clad carrier 10 can also include pressing a double-sided copper-clad board 24 on a substrate layer 12, and then performing the lid-opening block to form the above-mentioned structure.

In block 2, referring to FIGS. 3, 5, 6, and 7, an optical fiber 30 is formed in the first groove 22, the optical fiber 30 is coated with an insulating layer 32.

There may be one or more of the optical fiber 30.

Figure 16:
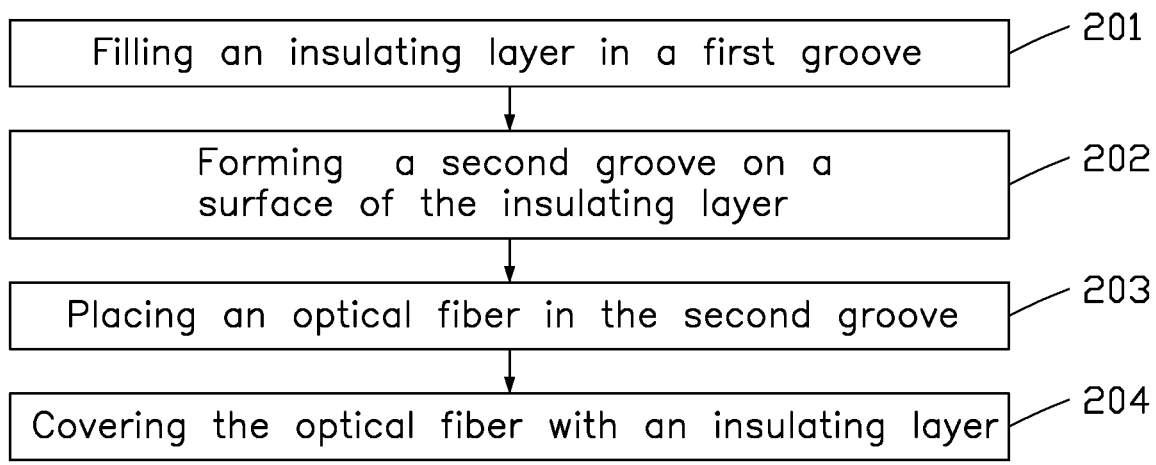
FIG. 16 is another sub-flowchart of the method of FIG. 14.

In some embodiments, referring to FIG. 16, the block of forming the optical fiber 30 covered by the insulating layer 32 in the first groove 22 may include the following blocks.

Figure 3:
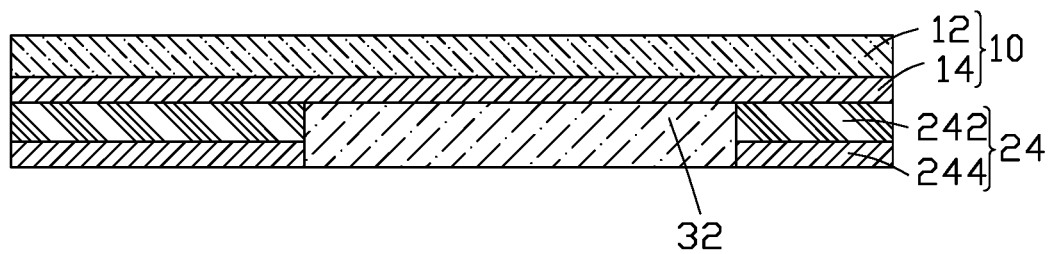
FIG. 3 is a cross-sectional view showing an insulating layer infilled into the first groove of FIG. 2.

In block 201, referring to FIG. 3, the insulating layer 32 is infilled in the first groove 22.

The insulating layer 32 is connected to a surface of the bottom copper layer 14. The insulating layer 32 is infilled, baked and cured, and a surface of the insulating layer 32 facing away from the copper-clad carrier 10 is smoothed.

In some embodiments, a surface of the insulating layer 32 facing away from the copper-clad carrier 10 may be flush with or below the surface of the intermediate circuit 20. That is, the insulating layer 32 fills all or part of the first groove 22. In this embodiment, the insulating layer 32 infills all the first groove 22, then, a copper clad board 24 with a first groove 22 is superimposed, and the insulating layer 32 is exposed from the first groove 22. The superimposed copper-clad board 24 will be fabricated to form the circuit layer 26 in subsequent processes.

Figure 5:
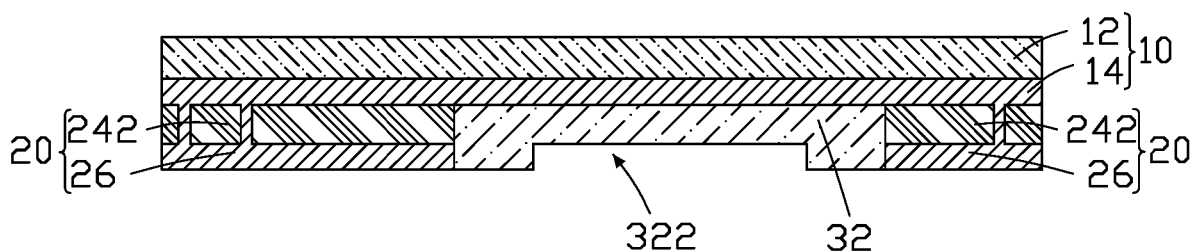
FIG. 5 is a cross-sectional view showing a second groove formed on the insulating layer of FIG. 4.

In block 202, referring to FIG. 5, a second groove 322 is formed on a surface of the insulating layer 32 facing away from the copper-clad carrier 10.

Figure 6:
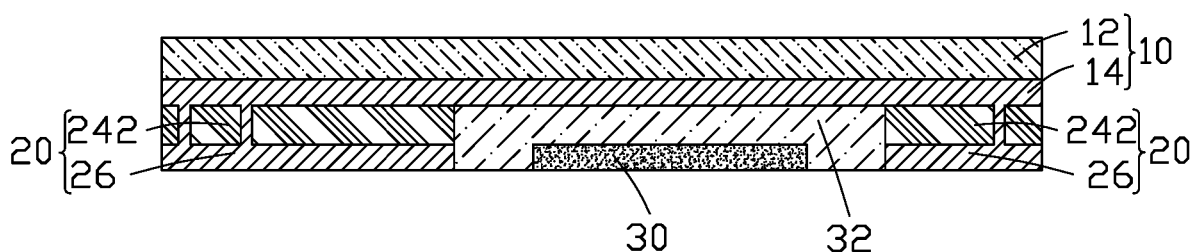
FIG. 6 is a cross-sectional view showing an optical fiber placed in the second groove of FIG. 5.

In block 203, referring to FIG. 6, the optical fiber 30 is placed in the second groove 322.

One or more optical fibers 30 can be placed in the second groove 322.

Figure 7:
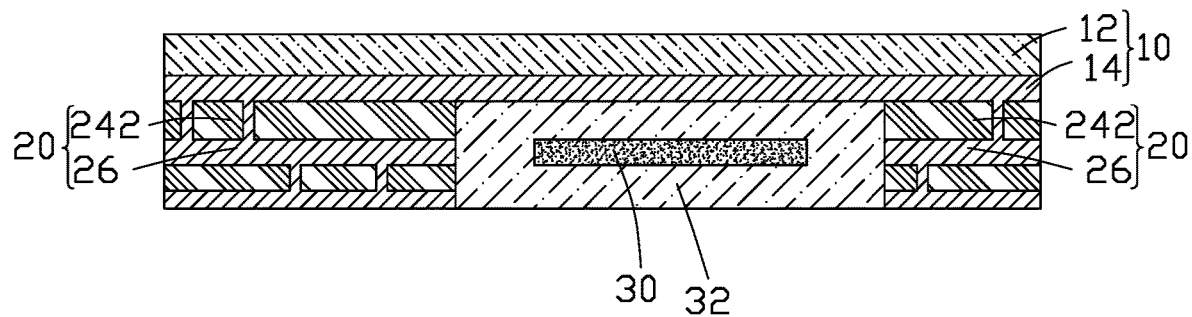
FIG. 7 is a cross-sectional view showing an insulating layer covering the optical fiber of FIG. 6.

In block 204, referring to FIG. 7, the insulating layer 32 is used to cover the optical fiber 30, that is, the optical fiber 30 is buried in the insulating layer 32.

Since the optical fiber 30 is relatively thin, it can be contained in a glue layer on a surface of the optical fiber 30 before covering the optical fiber 30 with the insulating layer 32, the material of the glue layer used is the same as that of the insulating layer 32. Then the insulating layer 32 is continuously coated on the optical fiber 30 and then dried and smoothed.

In some embodiments, the block 201 may be applied before the block 104, that is, the optical fiber 30 can be formed in the first groove 22 after the circuit is made.

Figure 8:
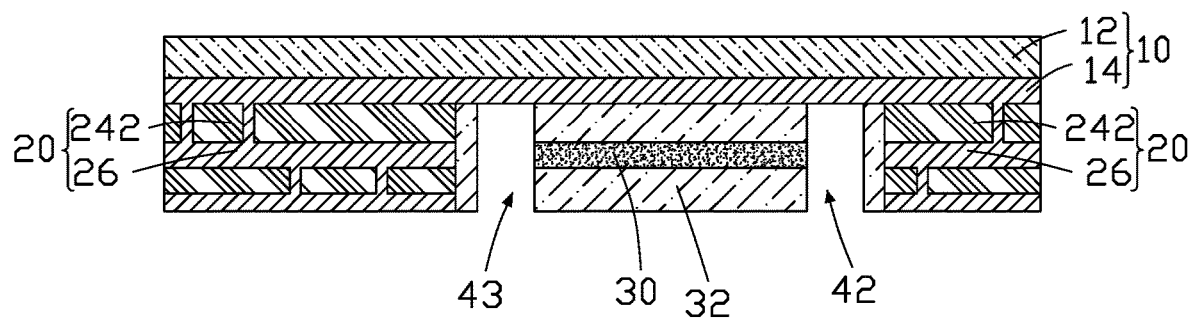
FIG. 8 is a cross-sectional view showing a first accommodating groove and a second accommodating groove formed at each end of the optical fiber of FIG. 7.

In block 3, referring to FIG. 8, a first accommodating groove 42 and a second accommodating groove 43 are formed at the ends of the optical fiber 30, the bottom copper layer 14 is exposed from the first accommodating groove 42 and the second accommodating groove 43.

The first accommodating groove 42 and the second accommodating groove 43 are recessed on the surface of the intermediate circuit 20 to face away from the copper-clad carrier 10 and until the bottom copper layer 14 is exposed from the first accommodating groove 42 and the second accommodating groove 43.

Figure 9:
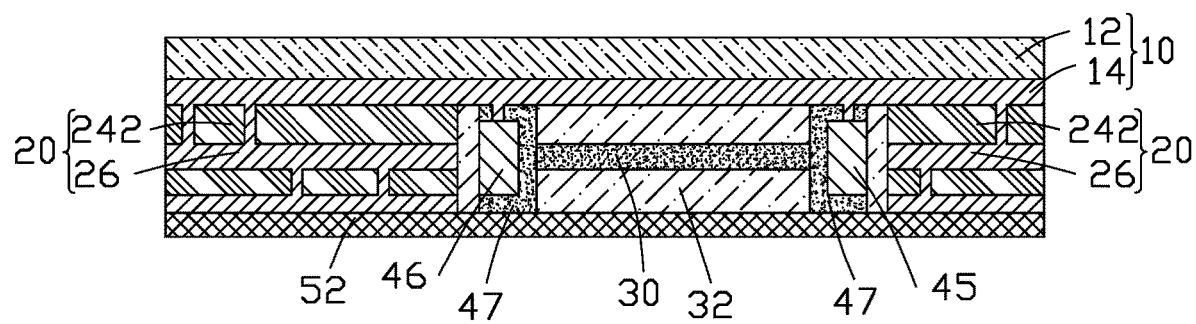
FIG. 9 is a cross-sectional view showing a first coupling element formed in the first accommodating groove and a second coupling element formed in the second accommodating groove of FIG. 8, the first coupling element and the second coupling element being encapsulated with a transparent glue.

In block 4, referring to FIG. 9, a first coupling element 45 is accommodated in the first accommodating groove 42, a second coupling element 46 is accommodated in the second accommodating groove 43, and the first coupling element 45 and the second coupling element 46 are encapsulated with the transparent glue 47.

Both the first coupling element 45 and the second coupling element 46 are optically aligned with the optical fiber 30, thus enabling reception and transmission of optical signals.

In some embodiments, the first accommodating groove 42 and the second accommodating groove 43 also delineate the ends of the optical fiber 30. That is, in the process of forming the first accommodating groove 42 and the second accommodating groove 43, the two ends of the optical fiber 30 are removed so that the optical fiber 30 is exposed from side walls of the first accommodating groove 42 and the second accommodating groove 43. The first coupling element 45 is accommodated in the first accommodating groove 42, the second coupling element 46 is accommodated in the second accommodating groove 43, and the first coupling element 45 and the second coupling element 46 are sealed with transparent glue 47. The ends of the optical fiber 30 connect with the first coupling element 45 and the second coupling element 46 through the transparent glue 47, which can effectively reduce the signal loss during the optical transmission process.

Figure 10:
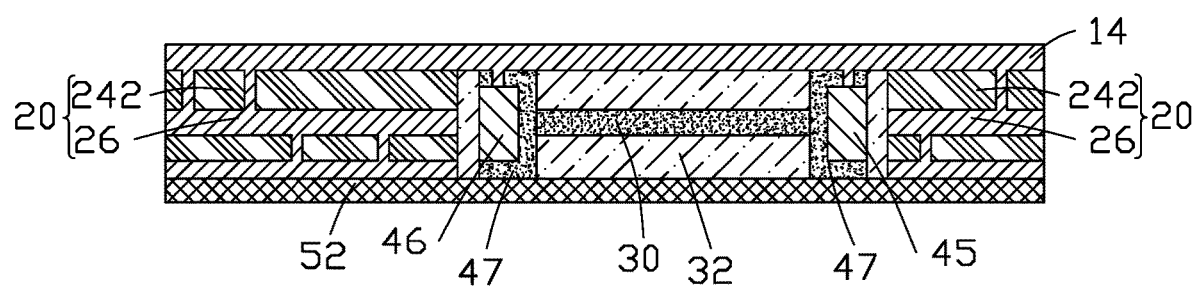
FIG. 10 is a cross-sectional view showing a first protective layer formed on the insulating layer and the transparent glue of FIG. 9, and a substrate layer removed.

In block 5, referring to FIG. 10, a first protective layer 52 is formed on the surface of the insulating layer 32 and the transparent glue 47 facing away from the copper-clad carrier 10, and then the substrate layer 12 is removed.

During the optical signal transmission process, the first protective layer 52 can protect the optical fiber 30, the first coupling element 45, and the second coupling element 46 and prevents external signals interfering with optical signals.

The first protective layer 52 further covers the surface of the intermediate circuit 20. The first protective layer 52 can protect the circuit layer 26 in the intermediate circuit 20 to prevent interference by external signals.

The substrate layer 12 is removed and the bottom copper layer 14 is exposed, which facilitates the removal of the bottom copper layer 14 corresponding to the optical fiber 30 in the subsequent manufacturing process.

Figure 11:
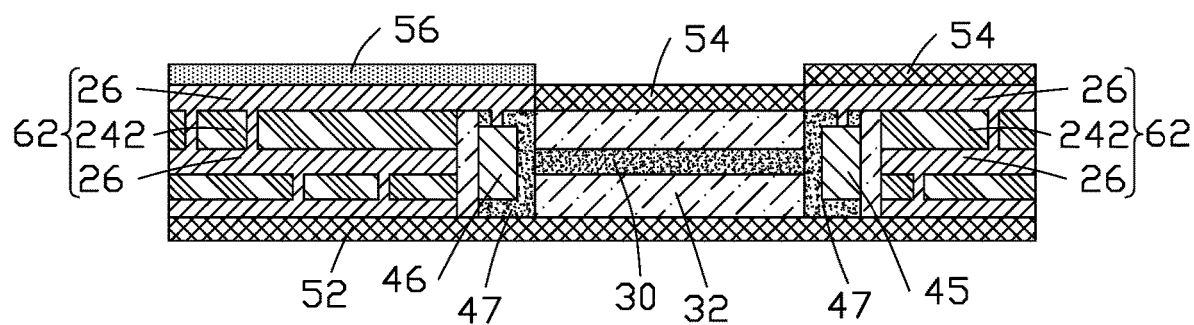
FIG. 11 is a cross-sectional view showing a bottom copper layer corresponding to the optical fiber of in FIG. 10 removed to obtain a first circuit substrate and a second circuit substrate, a second protective layer covering the insulating layer, and an ink layer covering the second circuit substrate.

In block 6, referring to FIG. 11, the bottom copper layer 14 corresponding to the optical fiber 30 is removed, and a second protective layer 54 covers the surface of the insulating layer 32. The intermediate circuit 20 on one side of the optical fiber 30 and the bottom copper layer 14 form a first circuit substrate 62, the intermediate circuit 20 on the other side of the optical fiber 30 and the bottom copper layer 14 form the second circuit substrate 64.

After the bottom copper layer 14 corresponding to the optical fiber 30 is removed, the insulating layer 32 is exposed, thereby facilitating the formation of the second protective layer 54 for protecting the optical fiber 30.

In some embodiments, the second protective layer 54 also covers the surface of the first circuit substrate 62. The second protective layer 54 further can protect the circuit layer 26 in the first circuit substrate 62 to prevent interference by external signals.

In block 7, referring to FIGS. 12 and 13, the chip 70 is electrically connected to the first circuit substrate 62, and the electronic component 80 is electrically connected to the second circuit substrate 64, thus the circuit board 100 including the first, second, and third areas I, II, and III, connected in sequence, is obtained.

The chip 70 and the electronic component 80 may be electrically connected to the first circuit substrate 62 and the second circuit substrate 64 through solder.

In some embodiments, when the electronic component 80 is an LED array, before the block of connecting the electronic component 80, the method further includes a block in which the ink layer 56 is applied to and covers the surface of the second circuit substrate 64 facing away from the first protective layer 52. The ink layer 56 is disposed on the surface of the second circuit substrate 64 to which the LED array is connected, and the ink layer 56 can improve the reflection efficiency of the LED array.

The circuit board 100 includes the optical fiber 30, the chip 70, and the electronic component 80. The chip 70 in the first area I and the electronic component 80 in the third area III are connected through the embedded optical fiber 30. Compared to an electrical connection through metal wires, the circuit board 100 has increased speed of data transmission and improved transmission efficiency. In addition, the optical fiber 30 is covered by the insulating layer 32, so that the optical signal is transmitted in the optical fiber 30, which reduces losses during optical signal transmission.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a photoelectric composite circuit board, comprising:

providing a copper-clad carrier and an intermediate circuit disposed on the copper-clad carrier, the copper-clad carrier comprising a substrate layer and a bottom copper layer on the substrate layer, the intermediate circuit comprising a first groove, and the bottom copper layer exposed from the first groove;

forming an optical fiber in the first groove, the optical fiber coated with an insulating layer;

forming a first accommodating groove and a second accommodating groove at each end of the optical fiber, and the bottom copper layer exposed from the first accommodating groove and the second accommodating groove;

accommodating a first coupling element in the first accommodating groove, accommodating a second coupling element in the second accommodating groove, and encapsulating the first coupling element and the second coupling element with a transparent glue;

removing the substrate layer;

removing the bottom copper layer corresponding to the optical fiber, the intermediate circuit on one side of the optical fiber and the bottom copper layer forming a first circuit substrate, the intermediate circuit on another side of the optical fiber and the bottom copper layer forming a second circuit substrate; and electrically connecting a chip to the first circuit substrate, and electrically connecting an electronic component to the second circuit substrate, to obtain the photoelectric composite circuit board.

2. The method of claim 1, wherein before removing the substrate layer, the method further comprises:

forming a first protective layer on a surface of the insulating layer and a surface of the transparent glue facing away from the copper-clad carrier.

3. The method of claim 2, wherein the first protective layer further covers the intermediate circuit.

4. The method of claim 1, wherein after removing the bottom copper layer corresponding to the optical fiber, the insulating layer is exposed, and the method further comprises:

covering a second protective layer on the insulating layer.

5. The method of claim 4, wherein the second protective layer further covers the first circuit substrate.

6. The method of claim 1, wherein forming the optical fiber in the first groove comprises:

filling the insulating layer in the first groove;

forming a second groove on a surface of the insulating layer facing away from the copper-clad carrier;

placing the optical fiber in the second groove; and covering the optical fiber with the insulating layer.

7. The method of claim 1, wherein the electronic component is an LED array, before connecting the electronic component to the second circuit substrate.

8. The method of claim 7, wherein the method further comprises:

covering an ink layer on a surface of the second circuit substrate facing away from the first protective layer.

9. The method of claim 1, wherein forming the copper-clad carrier and the intermediate circuit disposed on the copper-clad carrier comprises:

providing the copper-clad carrier;

pressing a copper-clad board onto the copper-clad carrier, and the copper-clad board comprises a dielectric layer and a copper layer; the dielectric layer covers a surface of the bottom copper layer;

along a stacking direction of the copper-clad carrier and the copper-clad board, forming the first groove penetrating the copper layer and the dielectric layer of the copper-clad board, and the bottom copper layer is exposed from the first groove; and performing a circuit fabrication on the copper layer of the copper-clad board to form a circuit layer, the intermediate circuit is formed on the copper-clad carrier.

10. The method of claim 1, wherein during forming the first accommodating groove and the second accommodating groove, two ends of the optical fiber are removed to cause the optical fiber to be exposed from the first accommodating groove and the second accommodating groove.

11. The method of claim 1, wherein the chip is electrically connected to the first circuit substrate through solder; the electronic component is electrically connected to the second circuit substrate through solder.

* * * * *